United States Patent
Adusumilli et al.

(10) Patent No.: US 10,903,424 B2
(45) Date of Patent: Jan. 26, 2021

(54) RESISTIVE RAM CELL STRUCTURE FOR GRADUAL SET PROGRAMMING

(71) Applicant: INTERNATIONAL BUSINESS MACHINES CORPORATION, Armonk, NY (US)

(72) Inventors: Praneet Adusumilli, Somerset, NJ (US); Takashi Ando, Tuckahoe, NY (US); Jianshi Tang, Elmsford, NY (US); Ramachandran Muralidhar, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/405,194

(22) Filed: May 7, 2019

(65) Prior Publication Data

US 2020/0357989 A1     Nov. 12, 2020

(51) Int. Cl.
*H01L 45/00*     (2006.01)
*H01L 27/24*     (2006.01)

(52) U.S. Cl.
CPC ...... *H01L 45/1286* (2013.01); *H01L 27/2463* (2013.01); *H01L 45/08* (2013.01); *H01L 45/1233* (2013.01); *H01L 45/1253* (2013.01); *H01L 45/146* (2013.01); *H01L 45/1683* (2013.01)

(58) Field of Classification Search
CPC . H01L 27/2463; H01L 45/08; H01L 45/1233; H01L 45/1253; H01L 45/1286; H01L 45/146; H01L 45/1683
See application file for complete search history.

(56) References Cited

U.S. PATENT DOCUMENTS

| 5,955,749 | A  | 9/1999 | Joannopoulos et al. |
| 7,176,245 | B2 | 2/2007 | Stucky et al. |
| 8,724,369 | B2 | 5/2014 | Zhang et al. |

(Continued)

FOREIGN PATENT DOCUMENTS

| WO | 2005106645 A2 | 11/2005 |
| WO | 2015127778 A1 | 9/2015 |

OTHER PUBLICATIONS

Karthaus et al, "Water-Assisted Formation of Micrometer-Size Honeycomb Patterns of Polymers", Langmuir—The ACS Journal of Surfaces and Colloids. Jul. 25, 2000. vol. 16. No. 15. pp. 6071-6076.

(Continued)

*Primary Examiner* — Allan R Wilson
(74) *Attorney, Agent, or Firm* — Tutunjian & Bitetto, P.C.; Randall Bluestone (57) ABSTRACT

A method is presented for enabling heat dissipation in resistive random access memory (RRAM) devices. The method includes forming a plurality of conductive lines within an interlayer dielectric (ILD) and forming a RRAM stack over a conductive line of the plurality of conductive lines, the RRAM stack including a bottom electrode, a conductive pillar, thermal conducting layers, and a top electrode. The thermal conducting layers are disposed on opposed ends of the conductive pillar. The thermal conducting layers directly contact the top electrode and the bottom electrode. The thermal conducting layers include aluminum oxide ($Al_2O_3$).

20 Claims, 7 Drawing Sheets

(56) References Cited

U.S. PATENT DOCUMENTS

| | | | |
|---|---|---|---|
| 8,861,258 | B2 | 10/2014 | Lan et al. |
| 9,312,002 | B2 | 4/2016 | Navon et al. |
| 10,475,997 | B1* | 11/2019 | Ando .................. H01L 45/1233 |
| 2008/0062740 | A1 | 3/2008 | Baek et al. |
| 2010/0112308 | A1* | 5/2010 | Russell .................. G11C 11/14 |
| | | | 428/195.1 |
| 2010/0117052 | A1* | 5/2010 | Venkatasamy ...... H01L 27/2463 |
| | | | 257/4 |
| 2012/0074374 | A1 | 3/2012 | Jo |
| 2014/0166971 | A1* | 6/2014 | Park .................... H01L 27/2463 |
| | | | 257/5 |
| 2017/0300806 | A1 | 10/2017 | Lee |
| 2019/0006422 | A1* | 1/2019 | Park .................... H01L 45/1675 |
| 2019/0355903 | A1* | 11/2019 | Lung .................. H01L 45/1625 |

OTHER PUBLICATIONS

Larcher et al, "Multiscale modeling of neuromorphic computing: from materials to device operations", 2017 IEEE International Electron Devices Meeting (IEDM). Dec. 2, 2017. pp. 1-4.

Leibler et al., "Theory of Microphase Separation in Block Copolymers", Macromolecules. Nov.-Dec. 1980. vol. 13. No. 6. pp. 1602-1617.

Marchewka et al., "Nanoionic Resistive Switching Memories: on the Physical Nature of the Dynamic Reset Process", Advanced Electronic Materials. Jan. 2016. vol. 2. No. 1. pp. 1-13.

Niraula et al., "Heat transfer and SET voltage in filamentary RRAM devices", arXiv preprint arXiv 1703.01228. Mar. 3, 2017. pp. 1-7.

Padovani et al., "Understanding and Optimization of Pulsed SET Operation in HfOx-Based RRAM Devices for Neuromorphic Computing Applications", IEEE Electron Device Letters. May 2018. vol. 39. No. 5. pp. 672-675.

Park et al., "Block Copolymer Lithography: Periodic Arrays of ~10 11 Holes in 1 Square Centimeter", Science. May 30, 1997. vol. 276. pp. 1401-1404.

Yu et al., "A Neuromorphic Visual System Using RRAM Synaptic Devices with Sub-pJ Energy and Tolerance of Variability: Experimental Characterization and Large-Scale Modeling", 2012 International Electron Devices Meeting. Dec. 10, 2012. pp. 1-4.

* cited by examiner

RESISTIVE RAM CELL STRUCTURE FOR GRADUAL SET PROGRAMMING

BACKGROUND

The present invention relates generally to semiconductor devices, and more specifically, to a resistive random access memory (RRAM) cell structure for gradual set programming.

Resistive random access memory (RRAM) is considered a promising technology for electronic synapse devices or memristors for neuromorphic computing as well as high-density and high-speed non-volatile memory applications. In neuromorphic computing applications, a resistive memory device can be employed as a connection (synapse) between a pre-neuron and post-neuron, representing the connection weight in the form of device resistance. Multiple pre-neurons and post-neurons can be connected through a crossbar array of RRAMs, which can express a fully-connected neural network configuration.

SUMMARY

In accordance with an embodiment, a method is provided for enabling heat dissipation in resistive random access memory (RRAM) devices. The method includes forming a plurality of conductive lines within an interlayer dielectric (ILD) and forming a RRAM stack over a conductive line of the plurality of conductive lines, the RRAM stack including a bottom electrode, a conductive pillar, thermal conducting layers, and a top electrode.

In accordance with another embodiment, a method is provided for enabling heat dissipation in resistive random access memory (RRAM) devices. The method includes forming a plurality of conductive lines within an interlayer dielectric (ILD), forming a bottom electrode over a conductive line of the plurality of conductive lines, depositing a thermal conducting layer over the bottom electrode, depositing a diblock co-polymer layer over the thermal conducting layer, the diblock co-polymer layer annealed to induce phase separation, selectively removing one phase from the phase separation, patterning the thermal conducting layer to create vias therein and filling the vias with a conductive material to define conductive pillars.

In accordance with yet another embodiment, a semiconductor device is provided for enabling heat dissipation in resistive random access memory (RRAM) devices. The semiconductor device includes a plurality of conductive lines disposed within an interlayer dielectric (ILD), a bottom electrode disposed in direct contact with a conductive line of the plurality of conductive lines, a conductive pillar disposed in direct contact with the bottom electrode, thermal conducting regions disposed in direct contact with the bottom electrode, the conductive pillar confined between the thermal conducting regions, and a top electrode disposed in direct contact with the conductive pillar and the thermal conducting regions.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

DETAILED DESCRIPTION

Embodiments in accordance with the present invention provide methods and devices for constructing resistive random access memory (RRAM) devices, and, in particular, employing one or more heat dissipation layers to achieve gradual switching in RRAM devices.

RRAMs can be employed for electronic synapse devices or memristors for neuromorphic computing as well as high-density and high-speed non-volatile memory applications. In neuromorphic computing applications, a resistive memory device can be employed as a connection (synapse) between a pre-neuron and post-neuron, representing a connection weight in the form of device resistance. Multiple pre-neurons and post-neurons can be connected through a crossbar array of RRAMs, which can be configured as a fully-connected neural network. Large scale integration of large RRAM arrays with complementary metal oxide semiconductor (CMOS) circuits can enable scaling of RRAM devices down to 10 nm and beyond for neuromorphic computing as well as high-density and high-speed non-volatile memory applications.

Hafnium oxide based RRAM devices are being explored for neuromorphic computing, particularly as synaptic elements, to achieve faster and more energy efficient vector matrix multiplications in neural networks. While RESET programming can be made gradual (thinning of the filament leading to a gradual decrease in conductivity), SET programming is usually abrupt, and, thus, limits the symmetry needed for a resistive processing unit. The primary reason for this abruptness is the acceleration of this process at elevated temperatures and the self-feeding nature of it due to the increased Joule heating as the filament becomes more conducting.

Embodiments in accordance with the present invention provide methods and devices for constructing RRAM devices with one or more heat dissipation elements that eliminate the abruptness of the SET programming. The exemplary embodiments of the present invention employ a metal oxide fin structure (e.g., hafnium oxide ($HfO_2$)) embedded in a thermal conducting layer (e.g., aluminum oxide ($Al_2O_3$)). The exemplary embodiments efficiently dissipate heat during forming and setting operations, and, thus, circumvent the self-feeding mechanism that causes the abrupt change in device resistance. Both the choice of materials and the geometric features facilitate the heat dissipation.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
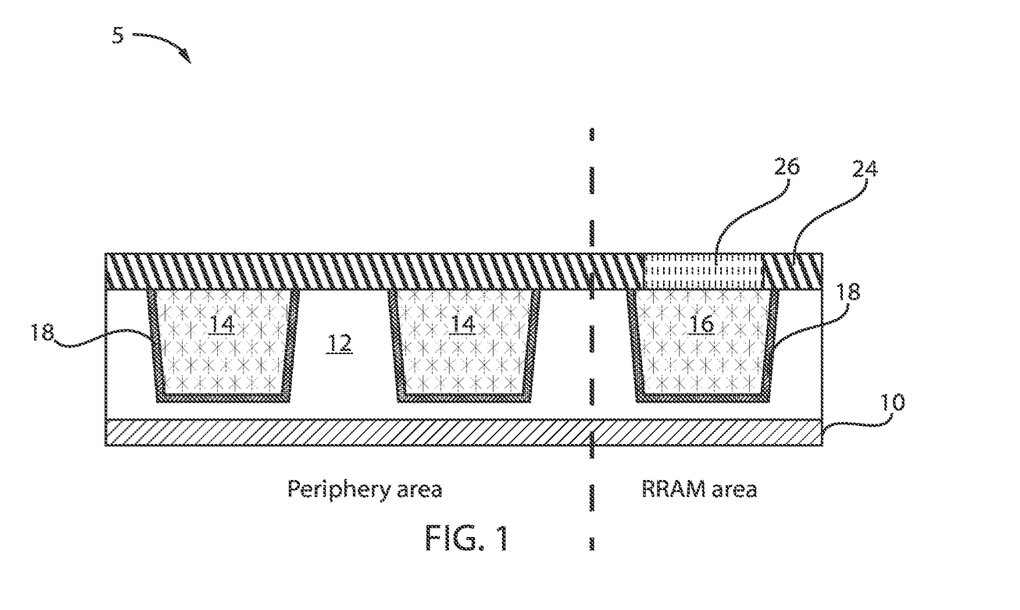
FIG. 1 is a cross-sectional view of a semiconductor structure including a plurality of conductive lines formed within a dielectric layer and where a bottom electrode is formed over and in direct contact with the exposed conductive line, in accordance with an embodiment of the present invention.

FIG. 1 is a cross-sectional view of a semiconductor structure including a plurality of conductive lines formed within a dielectric layer and where a bottom electrode is formed over and in direct contact with the exposed conductive line, in accordance with an embodiment of the present invention.

A semiconductor structure 5 includes a plurality of conductive lines 14, 16 formed within trenches of an inter-layer dielectric (ILD) 12. The ILD can be formed over a substrate 10. A conductive fill material or liner 18 can be formed or deposited around each of the trenches. In one example, the liner can be a tantalum nitride (TaN) liner 18 or in the alternative a tantalum (Ta) liner 18. In one example embodiment, the conductive fill material 18 can be deposited, for example, by electroplating, electroless plating, chemical vapor deposition (CVD), atomic layer deposition (ALD) and/or physical vapor deposition (PVD).

In various example embodiments, a dielectric 24 is deposited and a barrier layer 26 is formed over the exposed conductive line 16. The barrier layer 26 can be referred to as bottom electrode 26.

The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, GaAs, SiC, or SiGe. The substrate 10 can also have multiple material layers. In some embodiments, the substrate 10 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials. The semiconductor substrate 10 can also include a layered semiconductor such as, for example, Si/SiGe, a silicon-on-insulator or a SiGe-on-insulator. A portion or entire semiconductor substrate 10 can be amorphous, polycrystalline, or monocrystalline. In addition to the aforementioned types of semiconductor substrates, the semiconductor substrate 10 employed in the present invention can also include a hybrid oriented (HOT) semiconductor substrate in which the HOT substrate has surface regions of different crystallographic orientation.

The ILD 12 can include any materials known in the art, such as, for example, porous silicates, carbon doped oxides, silicon dioxides, silicon nitrides, silicon oxynitrides, or other dielectric materials. The ILD 12 can be formed using any method known in the art, such as, for example, chemical vapor deposition, plasma enhanced chemical vapor deposition, atomic layer deposition, or physical vapor deposition. The ILD 12 can have a thickness ranging from about 25 nm to about 200 nm.

The dielectric material of layer 12 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

The metal lines 14, 16 can be formed in the openings or trenches formed in the ILD 12. The metal lines 14, 16 can be any conductive materials known in the art, such as, for example, copper (Cu), aluminum (Al), or tungsten (W). The metal lines 14, 16 can be fabricated using any technique known in the art, such as, for example, a single or dual damascene technique. In an embodiment, not illustrated, the metal lines 14, 16 can be copper (Cu) and can include a metal liner, where a metal liner can be metals, such as, for example, tantalum nitride and tantalum (TaN/Ta), titanium, titanium nitride, cobalt, ruthenium, and manganese or a combination of these.

The dielectric layer 24 can be a nitride, for example, a silicon nitride (SiN), an oxynitride, for example, silicon oxynitride (SiON), or a combination thereof. In a preferred embodiment, the dielectric layer 24 can be silicon nitride (SiN), for example, $Si_3N_4$.

In one or more embodiments, the dielectric layer 24 can have a thickness in the range of about 20 nm to about 100 nm, or in the range of about 35 nm to about 75 nm, or in the range of about 45 nm to about 55 nm, although other thicknesses are contemplated.

The bottom electrode 26 can be, e.g. a titanium nitride (TiN) layer. The bottom electrode 26 extends over an entire upper surface of the conductive line 16. The bottom electrode 26 directly contacts the entire upper surface of the conductive line 16.

The bottom electrode 26 exists on metal lines in RRAM cross-bar array regions only and above the interlayer dielectric of the underlying level. Moreover, selective growth of bottom electrode 26 (e.g., TaN, TiN, W, Co, Ru) can be performed and a vertical resistance of the barrier layers can be sufficiently low compared to a low resistance state of the RRAM (~kOhm).

The bottom electrode 26 can include a conductive material, such as Cu, Al, Ag, Au, Pt, W, etc. In some embodiments, the bottom electrode 26 can include nitrides such as TiN, TaN, Ta or Ru.

Figure 2:
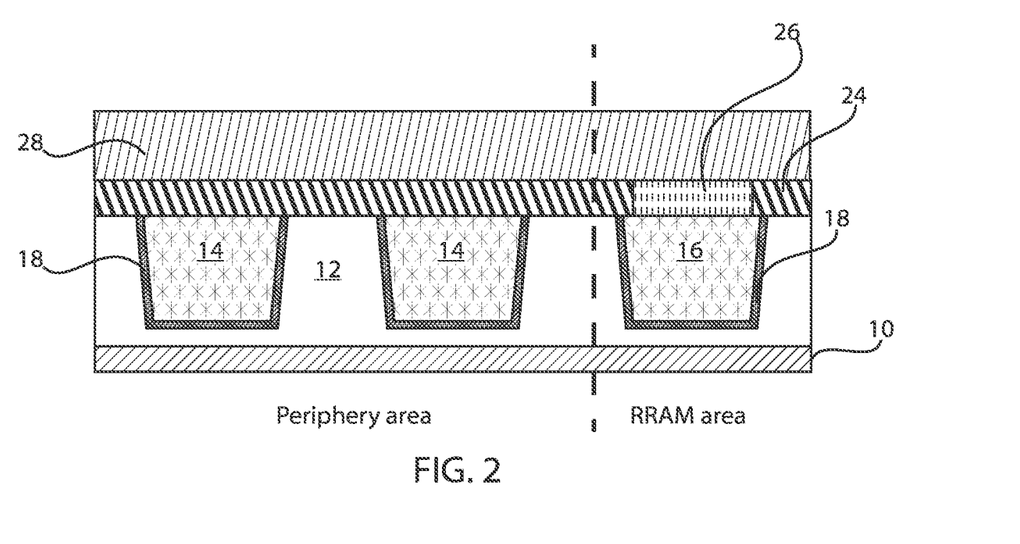
FIG. 2 is a cross-sectional view of the semiconductor structure of FIG. 1 where a dielectric layer is deposited over the plurality of conductive lines and in direct contact with the bottom electrode, in accordance with an embodiment of the present invention.

FIG. 2 is a cross-sectional view of the semiconductor structure of FIG. 1 where a dielectric layer is deposited over the plurality of conductive lines and in direct contact with the bottom electrode, in accordance with an embodiment of the present invention.

In various example embodiments, a dielectric layer 28 is deposited over the plurality of conductive lines 14, 16. The dielectric layer 28 can be, e.g., aluminum oxide ($Al_2O_3$). $Al_2O_3$ has a high thermal conductivity of approximately 36 W/mK and a high resistivity of at least $10^{14}$ ohm-cm. The dielectric layer 28 can also be referred to as a thermal conducting layer. The dielectric layer 28 can be deposited by, e.g., a chemical vapor deposition (CVD).

Figure 3:
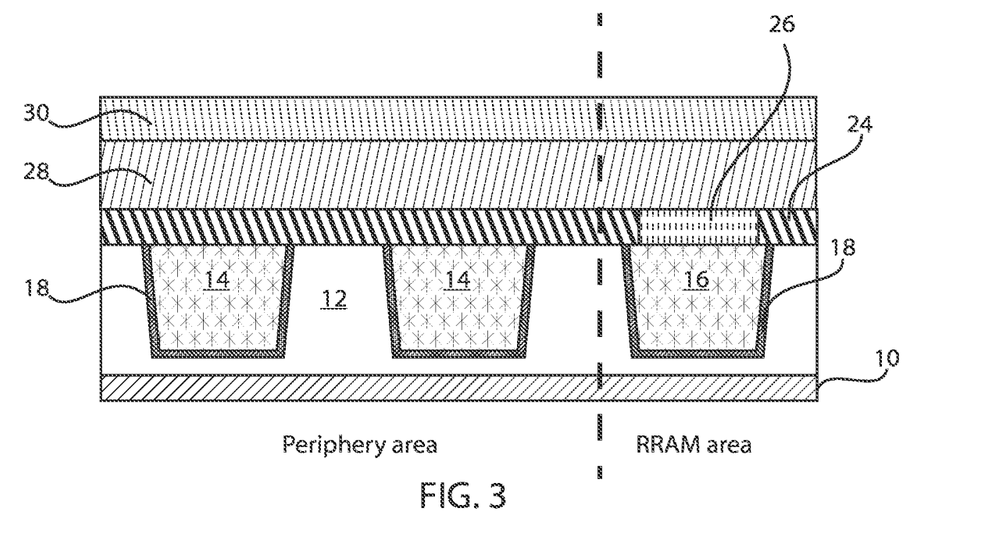
FIG. 3 is a cross-sectional view of the semiconductor structure of FIG. 2 where a diblock co-polymer layer is deposited over the dielectric layer, in accordance with an embodiment of the present invention.

FIG. 3 is a cross-sectional view of the semiconductor structure of FIG. 2 where a diblock co-polymer layer is deposited over the dielectric layer, in accordance with an embodiment of the present invention.

In various example embodiments, a diblock co-polymer layer 30 is deposited over the dielectric layer 28.

In one embodiment, the diblock copolymer material 30 is a polystyrene-block-polymethylmethacrylate (PS-b-PMMA) diblock copolymer. The polystyrene-block-polymethylmethacrylate (PS-b-PMMA) diblock copolymer self-assembles into a self-organized array of cylinders having a diameter, for example, from about 3 nm to about 50 nm. Other copolymer materials are also envisioned, such as example, polystyrene-block-polyethylene (PS-b-PE), polystyrene-block-polyorganosilicate (PS-b-POS), polystyrene-block-polyferrocenyldimethylsilate (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA).

An optional primer layer can be formed on the substrate before applying the diblock copolymer layer 30. The primer layer functions as a wetting layer to assist coverage by the diblock copolymer layer 30. The primer layer can include, e.g., a random copolymer layer. The diblock copolymer layer 30 can be applied using a spinning process. The composition of the diblock copolymer layer 30 can be adjusted to adjust the size and density of the resulting structures. The adjustment can include adjusting the composition of the first polymer to the second polymer, adjusting curing times, adjusting the diblock copolymer layer thickness, selecting a primer layer, etc. The diblock polymer layer 30 is preferably cured in a low temperature cure process (e.g., about 180° C.).

Figure 4:
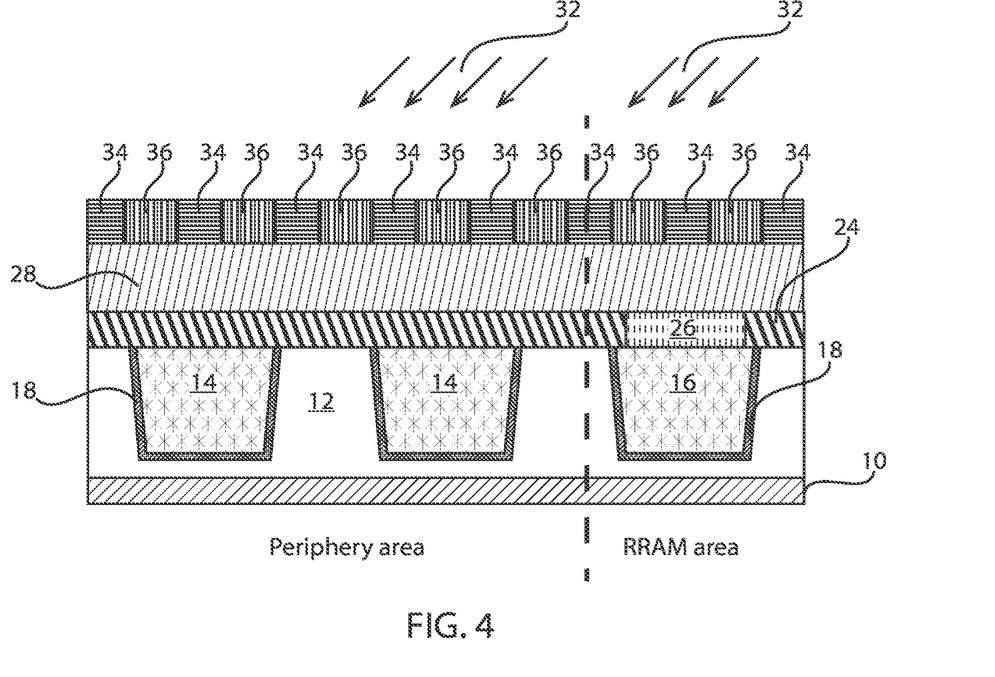
FIG. 4 is a cross-sectional view of the semiconductor structure of FIG. 3 where phase separation is induced for the diblock co-polymer layer to form a periodic honeycomb structure, in accordance with an embodiment of the present invention.

FIG. 4 is a cross-sectional view of the semiconductor structure of FIG. 3 where phase separation is induced for the diblock co-polymer layer to form a periodic honeycomb structure, in accordance with an embodiment of the present invention.

In various example embodiments, phase separation is induced by, e.g., annealing 32. The phase separation results in first polymer material 34 and second polymer material 36.

The annealing process can include an ultra-violet (UV) treatment and low temperature anneal (e.g., annealing temperature of about 120° C. to about 300° C.). The thermal annealing can last from less than about 1 hour to about 10 hours, and more particularly from about 0.1 hour to about 2 hours exposure and low temperature anneal.

Annealing or other treatments can induce phase separation of the diblock co-polymer layer 30 with a periodic honeycomb or hexagonal structure on the dielectric surface.

Therefore, a thin layer of self-assembling diblock copolymer 30 (having a thickness usually ranging from about 20 nm to about 100 nm) can be deposited over the dielectric layer 28 and annealed to form an ordered pattern including repeating structural units 34, 36. The polymer block units 34, 36 are embedded in a polymeric matrix. The polymer block units 34, 36 can be selectively removed relative to the polymeric matrix, thereby leaving openings. The polymer openings can then be used for sub-lithographic patterning of the device structure.

Figure 5:
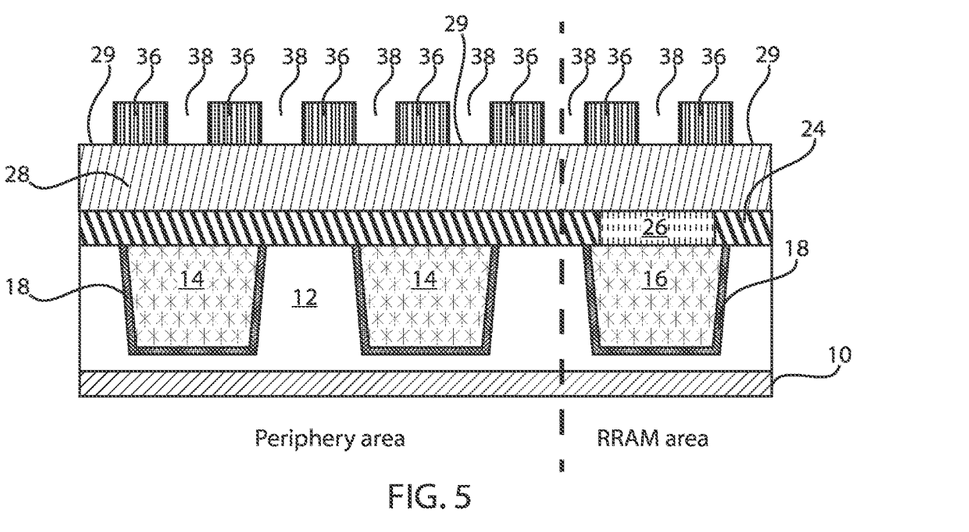
FIG. 5 is a cross-sectional view of the semiconductor structure of FIG. 4 where portions of the diblock co-polymer layer are removed, in accordance with an embodiment of the present invention.

FIG. 5 is a cross-sectional view of the semiconductor structure of FIG. 4 where portions of the diblock co-polymer layer are removed, in accordance with an embodiment of the present invention.

In various example embodiments, the first polymer material 34 is removed from the diblock copolymer layer 30 to form a plurality of distributed pores 38. The distribution is substantially uniform such that the pores 38 are equidistant from each other within a matrix. The selective removal of one of the phases creates a soft mask for pattern transfer.

The diblock copolymer layer 30 can include, e.g., polymethylmethacrylate (pmma) and polystyrene and removing the first polymer material can include removing the polymethylmethacrylate (pmma) using a solvent. The solvent can include, e.g., acetic acid. The removal of the first polymer material 34 results in a top surface 29 of the dielectric material 28 being exposed.

Figure 6:
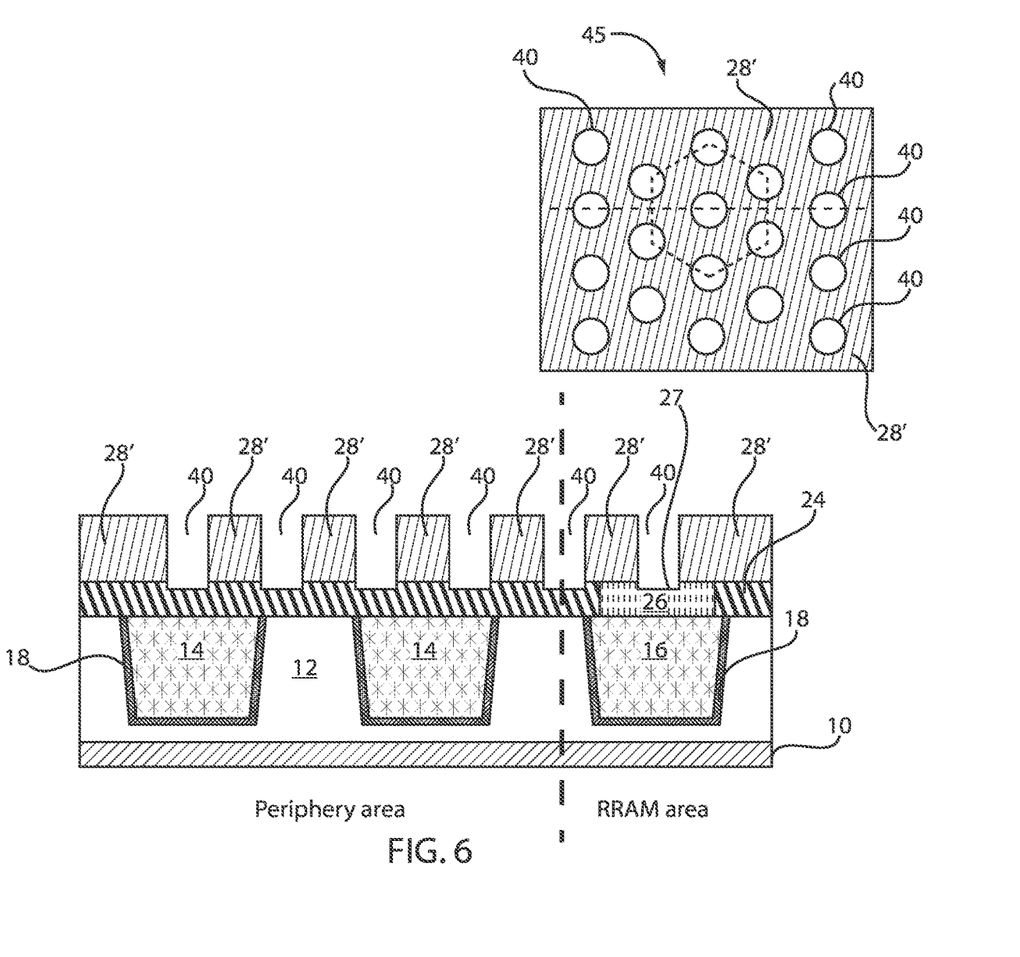
FIG. 6 is a cross-sectional view of the semiconductor structure of FIG. 5 where vias are patterned in the dielectric layer, in accordance with an embodiment of the present invention.

FIG. 6 is a cross-sectional view of the semiconductor structure of FIG. 5 where vias are patterned in the dielectric layer, in accordance with an embodiment of the present invention.

In various example embodiments, the dielectric layer 28 is patterned by removing the second polymer material 36 and creating openings or vias 40 within the dielectric layer 28. The vias 40 result in dielectric layer portions 28' defined over the plurality of conductive lines 14, 16. A top surface 27 of the bottom electrode 26 is also exposed.

A top view 45 further illustrates the matrix configuration or honeycomb structure on the dielectric surface 28'. Thus, the vias 40 can define honeycomb structures. Stated differently, the vias 40 can form hexagonally stacked openings or holes, with a diameter of about, e.g., about 10 nm to about 25 nm. The diameter can range from about 2 nm to about 100 nm. Hafnium oxide pillars (described below) are incorporated or embedded in this aluminum oxide matrix.

Figure 7:
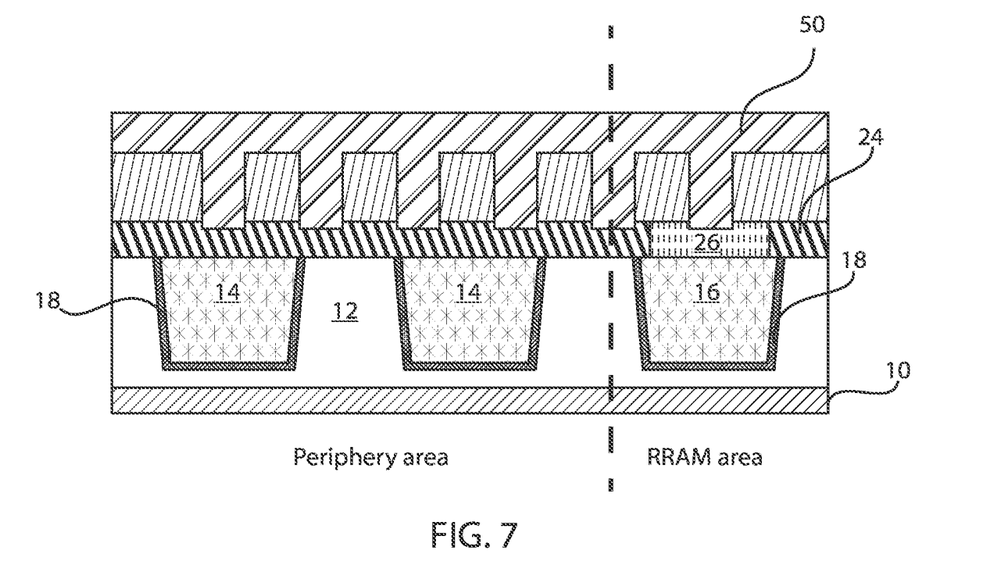
FIG. 7 is a cross-sectional view of the semiconductor structure of FIG. 6 where the vias are filled with a conductive material to construct conductive pillars, in accordance with an embodiment of the present invention.

FIG. 7 is a cross-sectional view of the semiconductor structure of FIG. 6 where the vias are filled with a conductive material to construct conductive pillars, in accordance with an embodiment of the present invention.

In various example embodiments, the vias 40 are filled with a conductive material 50 to construct conductive pillars. The conductive material 50 can be, e.g., a hafnium oxide ($HfO_2$) liner. However, the conductive material 50 can be any type of high-k dielectric layer, such as, but not limited to, $HfO_2$, HfSiO, HfSiON, HfZrO, $Ta_2O_5$, $ZrO_2$, $TiO_2$, $La_2O_3$, $Y_2O_3$, $Al_2O_3$, and mixtures thereof.

Figure 8:
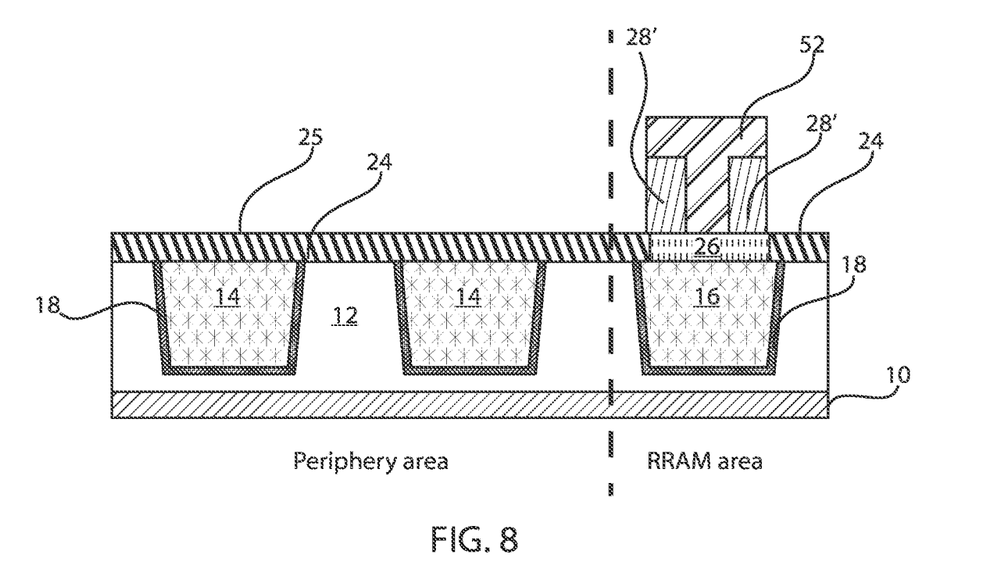
FIG. 8 is a cross-sectional view of the semiconductor structure of FIG. 7 where the conductive pillars are removed, except for conductive pillars formed over the bottom electrode, in accordance with an embodiment of the present invention.

FIG. 8 is a cross-sectional view of the semiconductor structure of FIG. 7 where the conductive pillars are removed, except for conductive pillars formed over the bottom electrode, in accordance with an embodiment of the present invention.

In various example embodiments, a cut mask or a reverse bottom electrode mask is employed to eliminate the conductive pillars 50 over unwanted areas. A conductive pillar region 52 remains over the dielectric layer portions 28' and the bottom electrode 26. The conductive pillar region 52 forms a substantially T-shaped configuration. The conductive pillar region 52 directly contacts the top surface of the bottom electrode 26. The conductive pillar region 52 separates a first dielectric layer portion 28' from a second dielectric layer portion 28'. The dielectric layer portions 28' are aligned with the conductive line 16.

Figure 9:
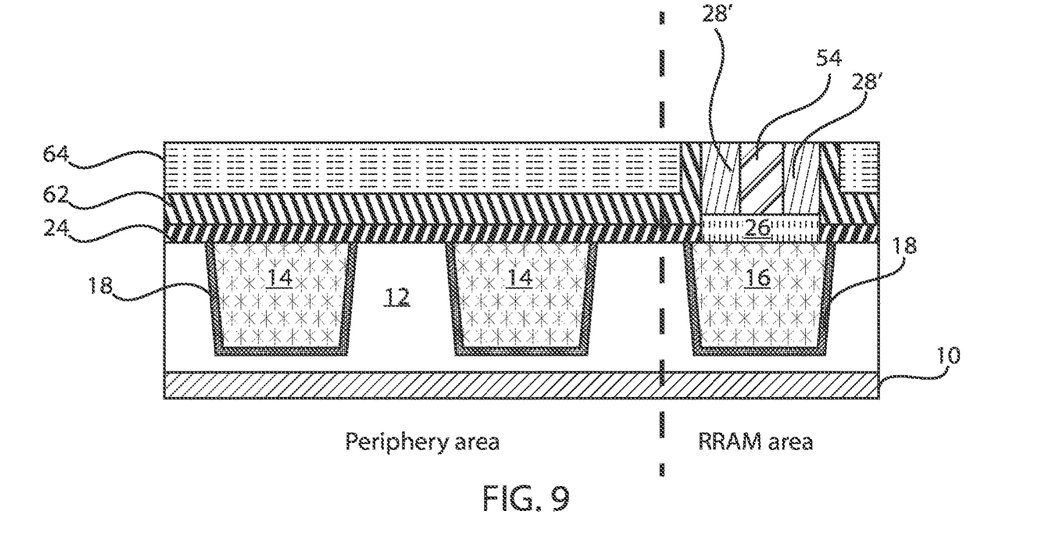
FIG. 9 is a cross-sectional view of the semiconductor structure of FIG. 8 where a dielectric liner and an ILD are deposited, in accordance with an embodiment of the present invention.

FIG. 9 is a cross-sectional view of the semiconductor structure of FIG. 8 where a dielectric liner and an ILD are deposited, in accordance with an embodiment of the present invention.

In various example embodiments, another dielectric layer 62 is deposited over the dielectric layer 24. Additionally, ILD 64 is deposited over the dielectric layer 62. The dielectric 62 can be a SiN liner.

ILD 64 can be, e.g., a low-k dielectric layer 64. A low-k dielectric material as used in the low-k dielectric layer 64 can have a dielectric constant that is less than 4.0, e.g., 3.9. In one embodiment, the low-k material layer 64 can have a dielectric constant ranging from about 1.0 to about 3.5. In another embodiment, the low-k material layer 64 can have a dielectric constant ranging from about 1.75 to about 3.2.

One example of a material suitable for the low-k materials for the low-k dielectric layer 64 can include silicon oxycarbonitride (SiOCN). Other low-k materials that can also be used for the low-k dielectric layer 64 can include fluorine doped silicon dioxide, carbon doped silicon dioxide, porous silicon dioxide, porous carbon doped silicon dioxide, organosilicate glass (OSG), diamond-like carbon (DLC) and combinations thereof.

In some embodiments, the low-k dielectric layer 64 can be conformally deposited using chemical vapor deposition (CVD). Variations of CVD processes suitable for forming the first dielectric layer include, but are not limited to, Atmospheric Pressure CVD (APCVD), Low Pressure CVD (LPCVD) and Plasma Enhanced CVD (PECVD), Metal-Organic CVD (MOCVD) and combinations thereof can also be employed. In some embodiments, the low-k dielectric layer 64 can have a thickness ranging from about 5 nm to about 30 nm. In another embodiment, the low-k dielectric layer 64 can have a thickness ranging from about 7 nm to about 15 nm.

In one example, the ILD 64 can be a TEOS hard mask (tetraethyl orthosilicate, $Si(OC_2H_5)_4$).

The ILD 64 can be planarized such that the top portion of the conductive pillar region 52 is removed to form conductive pillar 54. A top surface of the first and second dielectric layer portions 28' is also exposed. A top surface of the conductive pillar 54 is flush with the top surface of the first and second dielectric layer portions 28'. Thus, the conductive pillar 54 has a same height as the first and second dielectric layer portions 28'.

Figure 10:
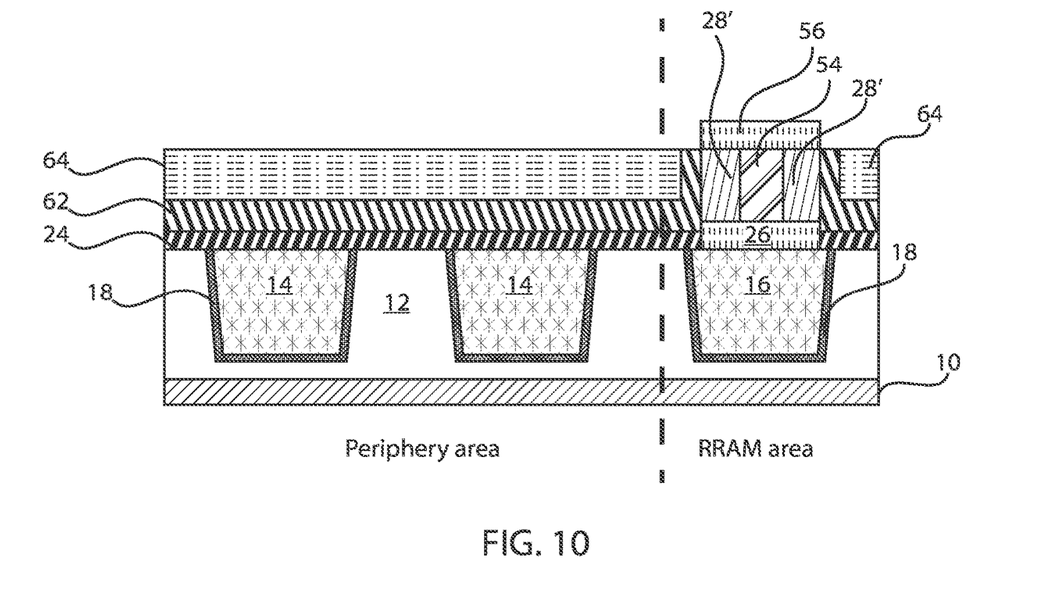
FIG. 10 is a cross-sectional view of the semiconductor structure of FIG. 9 where a top electrode is formed over the remaining conductive pillars and in alignment with the bottom electrode, in accordance with an embodiment of the present invention.

FIG. 10 is a cross-sectional view of the semiconductor structure of FIG. 9 where a top electrode is formed over the remaining conductive pillars and in alignment with the bottom electrode, in accordance with an embodiment of the present invention.

In various example embodiments, a top electrode 56 is deposited over the conductive pillar 54.

The top electrode 56 can include a conductive material, such as Cu, Al, Ag, Au, Pt, W, etc. In some embodiments, the top electrode 56 can include nitrides such as TiN, TaN, Ta or Ru. In a preferred embodiment, the top electrode 56 is titanium nitride (TiN).

The top electrode 56 directly contacts the conductive pillar 54. The top electrode 56 also directly contacts the first and second dielectric layer regions 28'. The top electrode 56 can have a same height and width as the bottom electrode 26. The top electrode 56 is in alignment with the bottom electrode 26. The conductive pillar 54 is sandwiched or confined directly between the bottom electrode 26 and the top electrode 56. In other words, the conductive pillar 54 directly contacts both the bottom and top electrodes 26, 56. The top electrode 56 can be formed from the same material as the bottom electrode 26, e.g., TiN.

Stated differently, a hafnium oxide pillar is sandwiched or confined between aluminum oxide pillars to dissipate heat during forming and setting operations to circumvent the self-feeding mechanism that causes the abrupt change in device resistance. The hafnium oxide pillar sandwiched between aluminum oxide pillars is further confined between a bottom electrode and a top electrode. Thus, Joule heat is transported away from the filament to control the SET (filament thickening) process. The addition of the aluminum oxide pillars enables for this effective heat dissipation. It can also be stated that the hafnium oxide pillar is embedded within an aluminum oxide matrix where the method to fabricate such structure employs diblock polymers. The exemplary embodiments thus employ a composite hafnium and aluminum oxide structure to facilitate gradual change in conductance using gradual SET programming.

Figure 11:
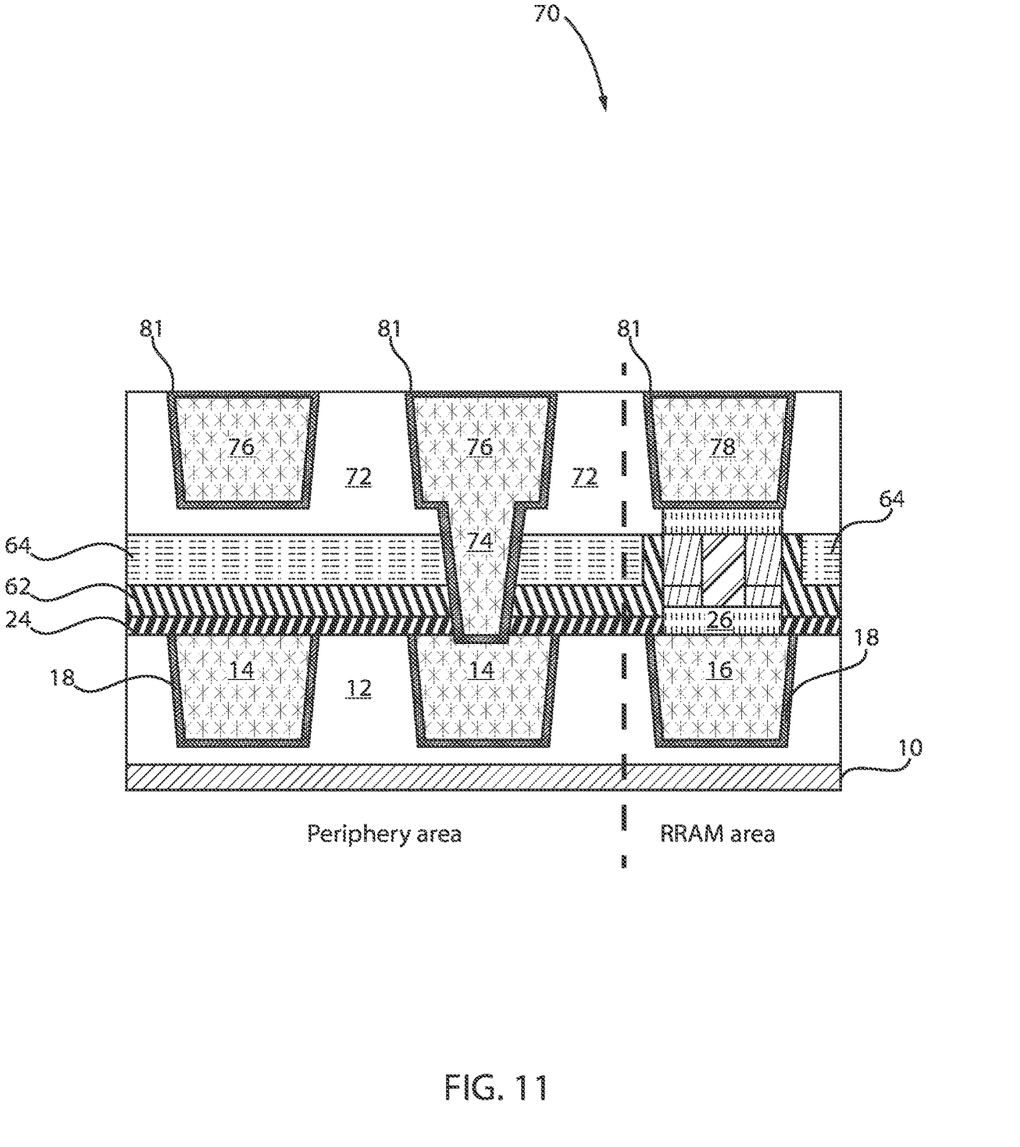
FIG. 11 is a cross-sectional view of the semiconductor structure of FIG. 10 where an ILD is deposited, vias are formed, and the vias are filled with a conductive material, in accordance with an embodiment of the present invention.

FIG. 11 is a cross-sectional view of the semiconductor structure of FIG. 10 where an ILD is deposited, vias are formed, and the vias are filled with a conductive material, in accordance with an embodiment of the present invention.

In various example embodiments, an ILD 72 is formed over the TEOS layer 64. Trenches are then formed within the ILD 72, as well as a via 74. The trenches are filled with a liner 81 and a conductive material 76, 78 to form final structure 70.

In various example embodiments, a tantalum nitride (TaN) liner 81 or in the alternative a tantalum (Ta) liner 81 can be deposited over or around the trenches. In one example embodiment, the conductive fill material or liner 81 can be deposited, for example, by electroplating, electroless plating, chemical vapor deposition (CVD), atomic layer deposition (ALD) and/or physical vapor deposition (PVD).

In various example embodiments, the conductive material 76, 78 can be metals including copper (Cu), cobalt (Co), aluminum (Al), platinum (Pt), gold (Au), tungsten (W), titanium (Ti), or any combination thereof. The metals can be deposited by a suitable deposition process, for example, chemical vapor deposition (CVD), plasma enhanced chemical vapor deposition (PECVD), physical vapor deposition (PVD), plating, thermal or e-beam evaporation, or sputtering.

In various exemplary embodiments, the height of the conductive material 76, 78 can be reduced by chemical-mechanical polishing (CMP) and/or etching. Therefore, the planarization process can be provided by CMP. Other planarization process can include grinding and polishing.

Figure 12:
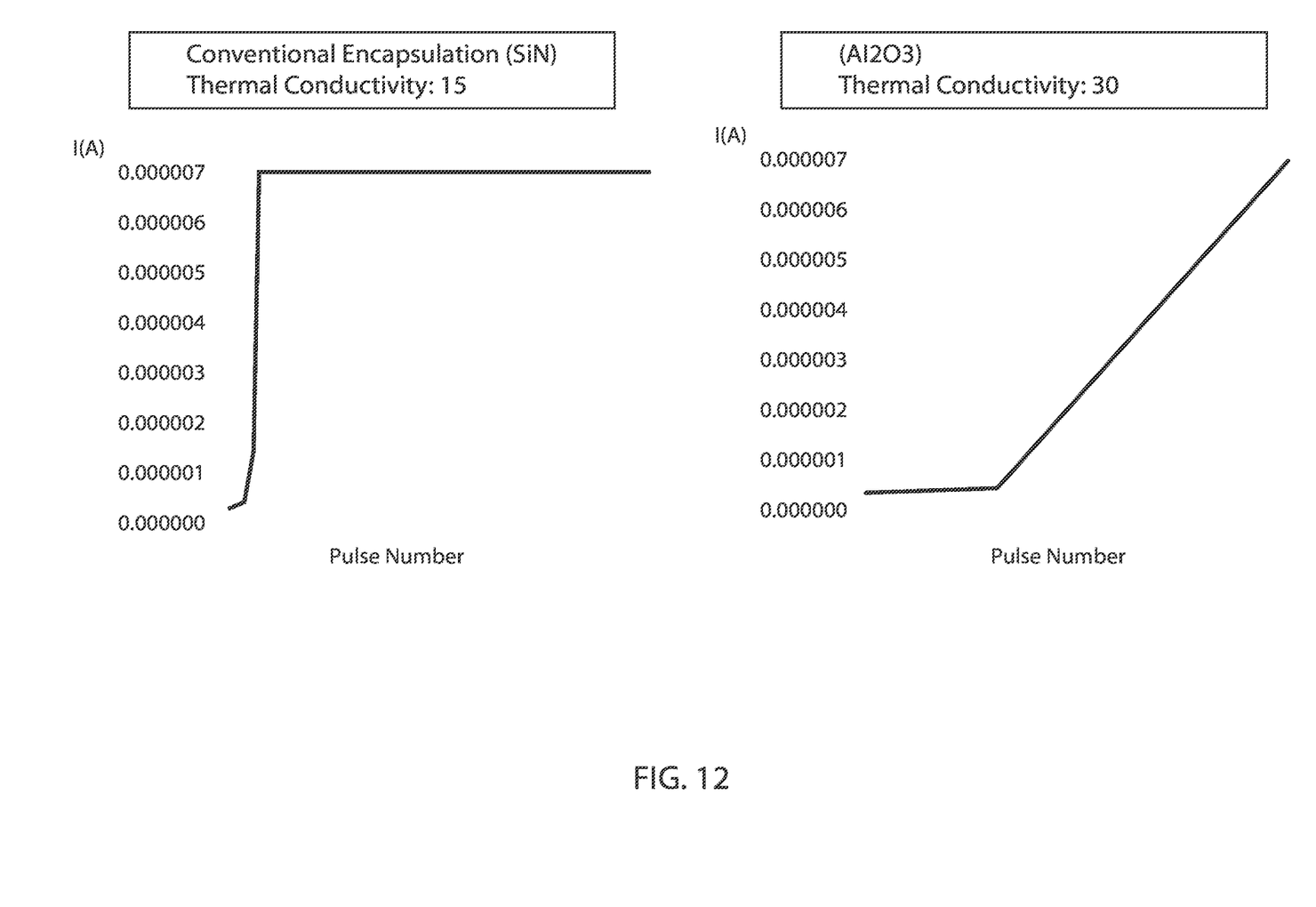
FIG. 12 are graphs illustrating constant voltage SET pulse response when employing aluminum oxide, in accordance with an embodiment of the present invention.

FIG. 12 are graphs illustrating constant voltage SET pulse response when employing aluminum oxide, in accordance with an embodiment of the present invention.

When conventional encapsulation is applied (e.g., SiN layer), the left-hand graph depicts the constant voltage SET pulse response. When the aluminum oxide layer is applied as the encapsulation layer, the right-hand graph depicts the constant voltage SET pulse response as a more linear function. Thus, the linearity of the SET trace is sensitive to the thermal conductivity of the oxide and the aluminum oxide layer tacks this linear trend.

In conclusion, the exemplary embodiments of the present invention employ a hafnium oxide pillar sandwiched or confined between aluminum oxide pillars to dissipate heat during forming and setting operations to circumvent the self-feeding mechanism that causes the abrupt change in device resistance. The hafnium oxide pillar sandwiched between aluminum oxide pillars is further confined between a bottom electrode and a top electrode. Therefore, a ReRAM structure with hafnium oxide pillars is embedded in a higher thermal conductivity dielectric layer, such as aluminum oxide.

Structure 70 (FIG. 11) enables transport of Joule heat away from the filament to control the filament thickening process or SET. Structure 70 includes a heat dissipation layer for achieving gradual switching. Stated differently, the exemplary embodiments employ a metal oxide fin structure ($HfO_2$) embedded in a thermal conducting layer ($Al_2O_3$). The exemplary embodiments efficiently dissipate heat during forming and setting operations, and, thus, circumvent the self-feeding mechanism that causes the abrupt change in the device resistance. Both the choice of materials and the geometric features facilitate the heat dissipation. In particular, a ReRAM structure with hafnium oxide fin embedded or incorporated within in a higher thermal conductivity ($Al_2O_3$) dielectric layer can achieve the desired results.

Moreover, in conclusion, a hafnium oxide based resistive RAM device embedded in aluminum oxide dielectric film is introduced, where the device allows for gradual change in conductance with partial SET programming. Aluminum oxide dielectric is only present between top and bottom electrodes. The hafnium oxide pillar critical dimension (CD) ranges from about 10 nm to about 15 nm. The method is a process to fabricate such a structure using diblock copolymers which phase separate into a honeycomb-like or hexagonal periodic structure. The $HfO_2$ pillars are not damaged by reactive ion etching. Also, the methods employ CVD and/or PVD $Al_2O_3$ deposition and ALD $HfO_2$ deposition to fabricate such a structure.

Regarding FIGS. 1-11, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for enabling heat dissipation in resistive random access memory (RRAM) devices by employing thermal heating elements (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for enabling heat dissipation in resistive random access memory (RRAM) devices, the method comprising:
    forming a plurality of conductive lines within an interlayer dielectric (ILD); and
    forming a RRAM stack over a conductive line of the plurality of conductive lines, the RRAM stack including a bottom electrode, a conductive pillar, thermal conducting layers, and a top electrode, wherein the thermal conducting layers occupy an entirety of a space defined between the top and bottom electrodes.

2. The method of claim 1, wherein the bottom electrode directly contacts the conductive line.

3. The method of claim 1, wherein the thermal conducting layers are disposed on opposed ends of the conductive pillar.

4. The method of claim 1, wherein the thermal conducting layers directly contact the top electrode and the bottom electrode.

5. The method of claim 1, wherein the thermal conducting layers include aluminum oxide ($Al_2O_3$).

6. The method of claim 1, wherein the conductive pillar directly contacts the top electrode and the bottom electrode.

7. The method of claim 1, wherein the conductive pillar is a hafnium oxide pillar.

8. The method of claim 1, wherein a via is formed over the conductive line to expose the top electrode of the RRAM stack, the via filled with a conductive material.

9. A method for enabling heat dissipation in resistive random access memory (RRAM) devices, the method comprising:
    forming a plurality of conductive lines within an interlayer dielectric (ILD);
    forming a bottom electrode over a conductive line of the plurality of conductive lines;
    depositing a thermal conducting layer over the bottom electrode;
    depositing a diblock co-polymer layer over the thermal conducting layer, the diblock co-polymer layer annealed to induce phase separation;
    selectively removing one phase from the phase separation;

patterning the thermal conducting layer to create vias therein; and filling the vias with a conductive material to define conductive pillars, the conductive pillars formed from and including a single material.

10. The method of claim 9, further comprising removing the conductive pillars such that a conductive region remains over the bottom electrode and thermal conducting regions remain adjacent the conductive region.

11. The method of claim 10, wherein the conductive region remaining over the bottom electrode has a substantially T-shaped configuration.

12. The method of claim 11, wherein the conductive region having the substantially T-shaped configuration is etched to form a single conductive pillar adjacent the thermal conducting regions.

13. The method of claim 12, further comprising depositing a top electrode over the single conductive pillar and the thermal conducting regions.

14. The method of claim 13, wherein the bottom electrode directly contacts the conductive line.

15. The method of claim 14, wherein the thermal conducting regions are disposed on opposed ends of the single conductive pillar.

16. The method of claim 15, wherein the thermal conducting regions directly contact the top electrode and the bottom electrode.

17. The method of claim 15, wherein the thermal conducting regions include aluminum oxide ($Al_2O_3$).

18. The method of claim 15, wherein the single conductive pillar directly contacts the top electrode and the bottom electrode, the single conductive pillar being a hafnium oxide pillar.

19. A semiconductor structure for enabling heat dissipation in resistive random access memory (RRAM) devices, the semiconductor structure comprising:

a plurality of conductive lines disposed within an interlayer dielectric (ILD);

a bottom electrode disposed in direct contact with a conductive line of the plurality of conductive lines;

an electrically conductive pillar disposed in direct contact with the bottom electrode;

thermal conducting regions disposed in direct contact with the bottom electrode, the electrically conductive pillar confined between the thermal conducting regions; and a top electrode disposed in direct contact with the electrically conductive pillar and the thermal conducting regions.

20. The semiconductor structure of claim 19, wherein the thermal conducting regions include aluminum oxide ($Al_2O_3$) and the electrically conductive pillar includes hafnium oxide.

* * * * *